US012813147B2

(12) United States Patent
Lee et al.

(10) Patent No.: US 12,813,147 B2
(45) Date of Patent: Nov. 24, 2026

(54) DISPLAY DEVICE

(71) Applicant: Samsung Display Co., LTD., Yongin-si (KR)

(72) Inventors: Jung-Woo Lee, Yongin-si (KR); Kyeong Jong Kim, Yongin-si (KR); Wooyoung Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 440 days.

(21) Appl. No.: 18/327,259

(22) Filed: Jun. 1, 2023

(65) Prior Publication Data

US 2024/0081133 A1 Mar. 7, 2024

(30) Foreign Application Priority Data

Sep. 7, 2022 (KR) ........................ 10-2022-0113638

(51) Int. Cl.

*H10K 59/80* (2023.01)
*H10K 59/40* (2023.01)
*H10K 59/12* (2023.01)

(52) U.S. Cl.

CPC ......... *H10K 59/8792* (2023.02); *H10K 59/40* (2023.02); *H10K 59/873* (2023.02); *H10K 59/12* (2023.02)

(58) Field of Classification Search

CPC .. H10K 59/8792; H10K 59/40; H10K 59/873; H10K 59/12; H10K 59/38;

(Continued)

(56) References Cited

U.S. PATENT DOCUMENTS

2016/0079567 A1* 3/2016 Cho .................... H10K 59/8731 257/40
2018/0011385 A1* 1/2018 Kang .................... H10K 50/856

(Continued)

FOREIGN PATENT DOCUMENTS

KR 10-2018-0027706 3/2018
KR 10-2020-0026381 3/2020

(Continued)

OTHER PUBLICATIONS

C. Diaz-Guerra, et al., Formation of β-Bi2O3 and δ-Bi2O3 during laser irradiation of Bi films studied in-situ by spatially resolved Raman spectroscopy, Journal of Alloys and Compounds, vol. 723, 2017, pp. 520-526, ISSN 0925-8388.

(Continued)

*Primary Examiner* — Steven B Gauthier
*Assistant Examiner* — Adam D Weiland
(74) *Attorney, Agent, or Firm* — Womble Bond Dickinson (US) LLP

(57) ABSTRACT

A display device according to an embodiment includes: a display area and a component area at least partly surrounded by the display area; a light-emitting device disposed on a substrate in the display area and including a first electrode, an emission layer, and a second electrode; a capping layer disposed on the light-emitting device; a first low reflection layer overlapping the display area in a plan view and a second low reflection layer overlapping the component area in a plan view, the first and second low reflection layers disposed on the capping layer; an encapsulation layer disposed on the first low reflection layer; and a reflection adjusting layer disposed on the encapsulation layer, wherein the second low reflection layer includes an inorganic oxide.

21 Claims, 10 Drawing Sheets

(58) Field of Classification Search
CPC ...... H10K 59/879; H10K 59/65; H10K 50/11; H10K 50/81; H10K 50/82; H10K 50/844; H10K 50/841–8428; H10K 50/85–865; H10H 20/852–854; H10H 20/855–856; H10H 29/852–854; H10H 29/855–856
See application file for complete search history.

(56) References Cited

U.S. PATENT DOCUMENTS

| | | | | |
|---|---|---|---|---|
| 2019/0214596 | A1* | 7/2019 | Park | G06F 3/0412 |
| 2020/0357871 | A1* | 11/2020 | Chung | H04N 23/57 |
| 2021/0208761 | A1* | 7/2021 | Park | G09G 3/3225 |
| 2022/0238848 | A1 | 7/2022 | Kwon et al. | |
| 2023/0393325 | A1* | 12/2023 | Sadeghi | G02B 6/0038 |

FOREIGN PATENT DOCUMENTS

| | | |
|---|---|---|
| KR | 10-2021-0081945 | 7/2021 |
| KR | 10-2022-0053756 | 5/2022 |
| KR | 10-2022-0097155 A | 7/2022 |
| KR | 10-2022-0108287 | 8/2022 |

OTHER PUBLICATIONS

Korean Intellectual Property Office Notice of Allowance for corresponding Korean Patent Application No. 10-2022-0113638, dated Jan. 22, 2026, 2 pages.

* cited by examiner

DISPLAY DEVICE

CROSS-REFERENCE TO RELATED APPLICATION

This application claims priority to and the benefit of Korean Patent Application No. 10-2022-0113638 under 35 U.S.C. § 119, filed in the Korean Intellectual Property Office on Sep. 7, 2022, the entire contents of which are incorporated herein by reference.

BACKGROUND

1. Technical Field

The described technology relates generally to a display device increasing transmittance of a component area.

2. Description of the Related Art

Display devices display images, and include a liquid crystal display (LCD), and an organic light emitting diode (OLED). The display devices are used to electronic devices such as mobile phones, GPS, digital cameras, electronic books, portable gaming devices, and various terminals.

Optical elements such as cameras or optical sensors are formed in a bezel region that is peripheral to the display area in the small electronic device such as the mobile phone, but as the area of the display area increases, methods for positioning the cameras or the optical sensors on a rear side of the display area are developed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device for increasing transmittance in a component area in which optical elements such as a camera may be positioned on a rear side of a display area.

An embodiment provides a display device including: a display area and a component area at least partly surrounded by the display area; a light-emitting device disposed on a substrate in the display area and including a first electrode, an emission layer, and a second electrode; a capping layer disposed on the light-emitting device; a first low reflection layer overlapping the display area in a plan view and a second low reflection layer overlapping the component area in a plan view, the first and second low reflection layers disposed on the capping layer; an encapsulation layer disposed on the first low reflection layer; and a reflection adjusting layer disposed on the encapsulation layer, wherein the second low reflection layer includes an inorganic oxide.

The first low reflection layer may include an inorganic material, and an absorption coefficient k of the inorganic oxide may be less than a corresponding absorption coefficient k of the inorganic material.

An absorption coefficient k of the inorganic oxide may be equal to or less than about 0.5.

The second low reflection layer may include a metal oxide.

The first low reflection layer may include an inorganic material, and the inorganic material may be bismuth (Bi), ytterbium (Yb), cobalt (Co), molybdenum (Mo), tin (Sn), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), or a combination thereof.

The inorganic oxide may be $Bi_2O_3$, $MoO_2$, $MoO_3$, $Ta_2O_5$, $NbO_2$, $SnO_2$, $ZrO_2$, $HfO_2$, $F_2O_3$, ZnO, ITO, CdO, $SiO_2$, $TiO_2$, $Al_2O_3$, $Y_2O_3$, BeO, MgO, $PbO_2$, $WO_3$, SiNx, LiF, $CaF_2$, $MgF_2$, CdS, or a combination thereof.

The second low reflection layer may be formed based on an oxidation treatment according to at least one of irradiation of laser beams, gas doping, and a plasma process.

The display device may further include a light blocking layer disposed between the encapsulation layer and the reflection adjusting layer, and having an opening overlapping the emission layer in a plan view.

The display device may include: a first conductive layer disposed on the encapsulation layer; a first touch insulating layer disposed on the first conductive layer; a second conductive layer disposed on the first touch insulating layer; and a second touch insulating layer disposed on the second conductive layer.

The display device may further include an optical element overlapping the component area in a plan view, wherein the optical element is disposed on a rear side of the substrate.

A thickness of the second low reflection layer may be about 1 nm to about 100 nm.

An embodiment provides a display device including: a housing; a cover window disposed on an upper portion of the housing; a display panel disposed on a lower portion of the cover window and including a display area and a component area surrounded by the display area; and an optical element disposed on a rear side of the display panel and overlapping the component area in a plan view, wherein the display panel includes a light-emitting device overlapping the display area in a plan view and including a first electrode, an emission layer, and a second electrode, a capping layer disposed on the light-emitting device, a first low reflection layer overlapping the display area in a plan view and a second low reflection layer overlapping the component area in a plan view, the first and second low reflection layers disposed on the capping layer, an encapsulation layer disposed on the first low reflection layer, and a reflection adjusting layer disposed on the encapsulation layer, and wherein the second low reflection layer includes an inorganic oxide.

The first low reflection layer may include an inorganic material, and an absorption coefficient k of the inorganic oxide may be less than a corresponding absorption coefficient k of the inorganic material.

An absorption coefficient k of the inorganic oxide may be equal to or less than about 0.5.

The second low reflection layer may include a metal oxide.

The first low reflection layer may be an inorganic material, and the inorganic material may include bismuth (Bi), ytterbium (Yb), cobalt (Co), molybdenum (Mo), tin (Sn), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), or a combination thereof.

The inorganic oxide may be $Bi_2O_3$, $MoO_2$, $MoO_3$, $Ta_2O_5$, $NbO_2$, $SnO_2$, $ZrO_2$, $HfO_2$, $F_2O_3$, ZnO, ITO, CdO, $SiO_2$, $TiO_2$, $Al_2O_3$, $Y_2O_3$, BeO, MgO, $PbO_2$, $WO_3$, SiNx, LiF, $CaF_2$, $MgF_2$, CdS, or a combination thereof.

The second low reflection layer may be formed based on an oxidation treatment according to at least one of irradiation of laser beams, gas doping, and a plasma process.

The display device may further include a light blocking layer disposed between the encapsulation layer and the reflection adjusting layer, and having an opening overlapping the emission layer in a plan view.

A thickness of the second low reflection layer may be about 1 nm to about 100 nm.

According to the embodiments, the display device in which transmittance is increased in the component area may be provided.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
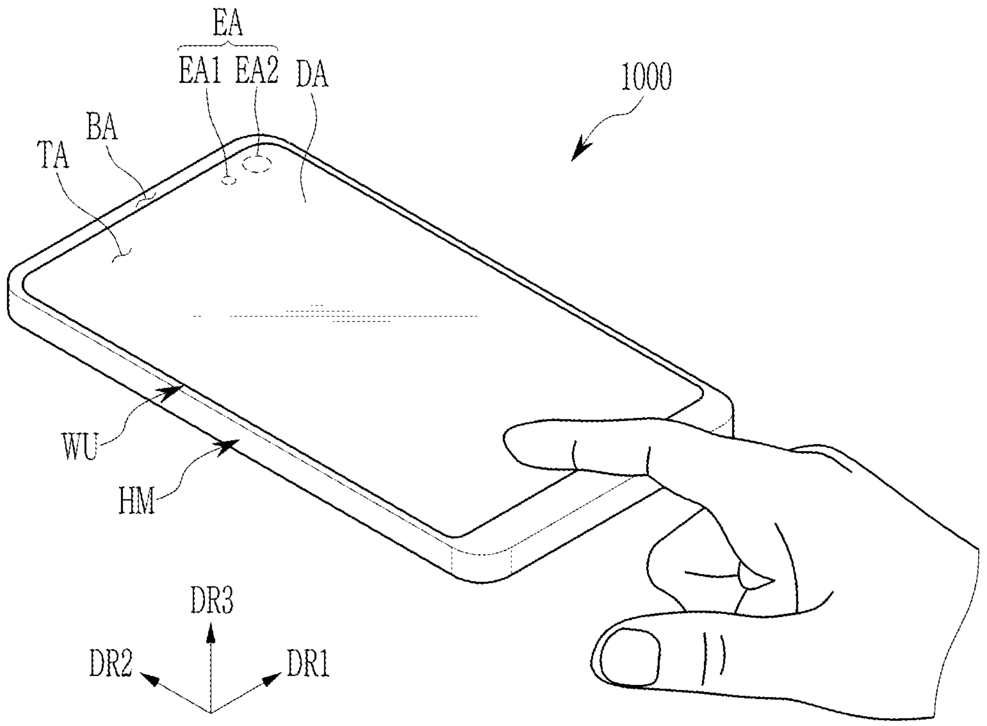
FIG. 1 shows a perspective view of a state of using a display device according to an embodiment.

The disclosure will be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In order to clearly describe the disclosure, parts that are irrelevant to the description are omitted, and identical or similar constituent elements throughout the specification are denoted by the same reference numerals.

In the drawings, sizes, thicknesses, ratios, and dimensions of the elements may be exaggerated for ease of description and for clarity. Like numbers and/or reference characters refer to like elements throughout. As used herein, the singular forms, “a,” “an,” and “the” are intended to include the plural forms as well, unless the context clearly indicates otherwise.

In the specification and the claims, the term “and/or” is intended to include any combination of the terms “and” and “or” for the purpose of its meaning and interpretation. For example, “A and/or B” may be understood to mean “A, B, or A and B.” The terms “and” and “or” may be used in the conjunctive or disjunctive sense and may be understood to be equivalent to “and/or.”

In the specification and the claims, the phrase “at least one of” is intended to include the meaning of “at least one selected from the group of” for the purpose of its meaning and interpretation. For example, “at least one of A and B” may be understood to mean “A, B, or A and B.”

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms “below”, “beneath”, “lower”, “above”, “upper”, or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned “below” or “beneath” another device may be placed “above” another device. Accordingly, the illustrative term “below” may include both the lower and upper positions. The device may also be oriented in other directions and thus the spatially relative terms may be interpreted differently depending on the orientations.

The terms “overlap” or “overlapped” mean that a first object may be above or below or to a side of a second object, and vice versa. The term “overlap” may include layer, stack, face or facing, extending over, covering, or partly covering or any other suitable term as would be appreciated and understood by those of ordinary skill in the art.

The terms “face” and “facing” mean that a first element may directly or indirectly oppose a second element. In a case in which a third element intervenes between the first and second element, the first and second element may be understood as being indirectly opposed to one another, although still facing each other.

When an element is described as “not overlapping” or “to not overlap” another element, this may include that the elements are spaced apart from each other, offset from each other, or set aside from each other or any other suitable term as would be appreciated and understood by those of ordinary skill in the art.

It will be understood that when an element such as a layer, film, region, or substrate is referred to as being “on” another element, it can be directly on the other element or intervening elements may also be present. In contrast, when an element is referred to as being “directly on” another element, there are no intervening elements present. Further, in the specification, the word “on” or “above” means positioned on or below the object portion, and does not mean positioned on the upper side of the object portion based on a gravitational direction.

The terms “comprises,” “comprising,” “includes,” and/or “including,”, “has,” “have,” and/or “having,” and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" or "on a plane" means viewing the object from the top, and the phrase "in a schematic cross-sectional view" or "on a cross-section" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

Embodiments may be described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies.

In the case of the blocks, units, and/or modules being implemented by microprocessors or other similar hardware, they may be programmed and controlled using software (for example, microcode) to perform various functions discussed herein and may optionally be driven by firmware and/or software.

It is also contemplated that each block, unit, and/or module may be implemented by dedicated hardware, or as a combination of dedicated hardware to perform some functions and a processor (for example, one or more programmed microprocessors and associated circuitry) to perform other functions.

Each block, unit, and/or module of embodiments may be physically separated into two or more interacting and discrete blocks, units, and/or modules without departing from the scope of the disclosure.

Further, the blocks, units, and/or modules of embodiments may be physically combined into more complex blocks, units, and/or modules without departing from the scope of the disclosure.

Figure 2:
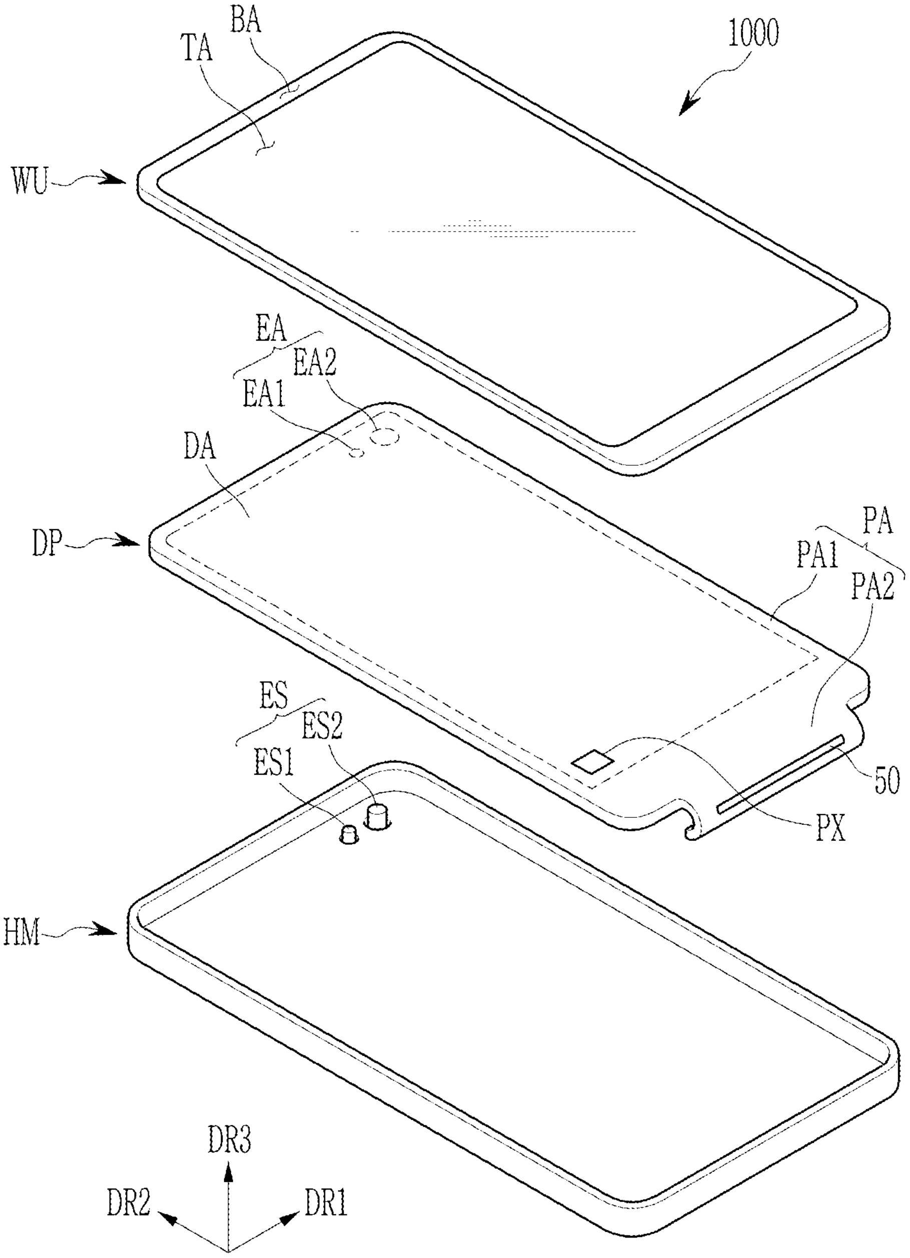
FIG. 2 shows an exploded perspective view of a display device according to an embodiment.
Figure 3:
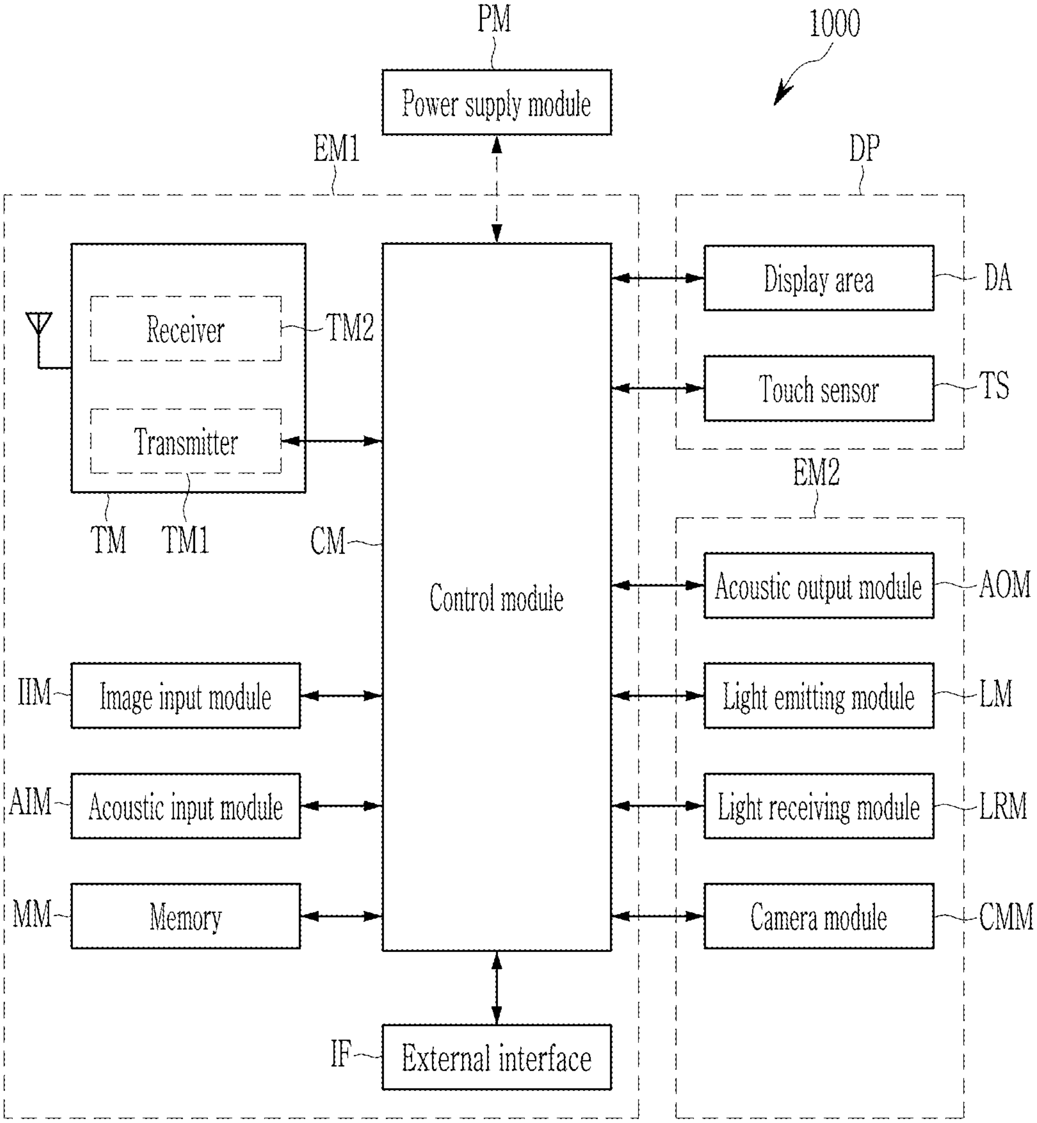
FIG. 3 shows a block diagram of a display device according to an embodiment.

A structure of a display device will now be described with reference to FIG. 1 to FIG. 3. FIG. 1 shows a perspective view of a state of using a display device according to an embodiment, FIG. 2 shows an exploded perspective view of a display device according to an embodiment, and FIG. 3 shows a block diagram of a display device according to an embodiment.

Referring to FIG. 1, the display device 1000 represents a device for displaying videos or still images, and it may be used as a display screen for portable electronic devices such as mobile phones, smartphones, tablet personal computers (PC), mobile communication terminals, electronic organizers, electronic books, portable multimedia players (PMPs), global positioning systems, or ultra mobile PCs (UMPCs), and also for various products such as televisions, laptops, monitors, advertisement boards, or the internet of things (IOT). The display device 1000 may also be used for wearable devices such as smart watches, watch phones, glasses-type displays, or head mounted displays (HMD). The display device 1000 may be used as a dashboard of a vehicle, a center information display (CID) disposed on a center fascia or a dashboard of a vehicle, a room mirror display replacing a side-view mirror of a vehicle, and a display disposed on a rear side of a front seat for entertainment for a back seat of a vehicle. FIG. 1 shows that the display device 1000 may be used as a smartphone, for better comprehension and ease of description.

The display device 1000 may display images in a third direction DR3 to a displaying side in parallel to a first direction DR1 and a second direction DR2. A displaying side on which images are displayed may correspond to a front surface of the display device 1000, and may correspond to a front surface of a cover window WU. The images may include videos and still images.

In an embodiment, front surfaces (upper sides) and bottom surfaces (lower sides) of respective members may be defined with respect to the image displaying direction. The front surface and the bottom surface oppose each other in the third direction DR3, and normal directions of the respective front surface and the bottom surface may be parallel to the third direction DR3. A spaced distance between the front surface and the bottom surface in the third direction DR3 may correspond to the thickness of the display panel in the third direction DR3.

The display device 1000 may sense an input of a user applied from an outside. The user input may include various types of external inputs such as some of a human body of the user, light, heat, or pressure. The user input is shown to be a hand of the user applied to the front surface. The user input may be provided in various forms, and the display device 1000 may sense the user input applied to the lateral side or the bottom surface of the display device 1000 according to the structure of the display device 1000

Referring to FIG. 1 and FIG. 2, display device 1000 may include a cover window WU, a housing HM, a display panel DP and an optical element ES. The cover window WU may be combined with the housing HM to form an exterior of the display device 1000.

The cover window WU may include an insulation panel. For example, the cover window WU may be made of glass, plastic, or a combination thereof.

The front surface of the cover window WU may define the front surface of the display device 1000. The transmission area TA may be an optically transparent region. For example, the transmission area TA may have visible ray transmittance of equal to or greater than about 90%.

A blocking area BA may define a shape of the transmission area TA. The blocking area BA may be disposed near the transmission area TA and may surround the transmission area TA. The blocking area BA may have relatively lower light transmittance than the transmission area TA. The blocking area BA may include an opaque material for blocking light. The blocking area BA may have a selected color (e.g., a predetermined color). The blocking area BA may be defined by a bezel layer provided in addition to a transparent substrate for defining the transmission area TA, or may be defined by an ink layer inserted into or colored to the transparent substrate.

The display panel DP may include a display pixel PX for displaying images and a driver 50, and the display pixel PX may be positioned in the display area DA. The display panel DP may include a front surface including a display area DA and a non-display area PA. The display area DA may include pixels and may display images. A touch sensor may be positioned on an upper side of the display area DA in the third direction DR3 of the pixel, and the display area DA thus may sense external inputs.

The transmission area TA of the cover window WU may at least partly overlap the display area DA of the display panel DP and a component area EA. For example, the transmission area TA may overlap the entire sides of the display area DA and the component area EA, or may overlap at least part of the display area DA and the component area EA. Hence, the user may see the images through the transmission area TA or may provide external inputs based on the images. Depending on embodiments, the region in which images are displayed may be separated from the region from which external inputs are sensed.

The non-display area PA of the display panel DP may at least partly overlap the blocking area BA of the cover window WU. The non-display area PA may be covered by the blocking area BA. The non-display area PA may be disposed near the display area DA, and may surround the display area DA. The non-display area PA displays no images, and a driving circuit for driving the display area DA or driving wires may be disposed therein. The non-display area PA may include a first peripheral area PA1 positioned outside the display area DA and a second peripheral area PA2 including a driver 50, connection wires, and a bending region. The non-display area PA may include a first peripheral area PA1 positioned on an outside of the display area DA, and a second peripheral area PA2 including a driver 50, a connection wire, and a bending region.

The display panel DP may be assembled in a flat state so that the display area DA, the component area EA, and the non-display area PA may face the cover window WU; for example, the display panel DP may be disposed on a lower portion of the cover window WU. A predetermined portion of the non-display area PA of the display panel DP may be bent. Part of the non-display area PA faces the bottom surface of the display device 1000 such that the blocking area BA seen on the front surface of the display device 1000 may be reduced, and in FIG. 2, the second peripheral area PA2 may be bent to be positioned on the bottom surface of the display area DA and be assembled.

The display panel DP may include a component area EA, and may include a first component area EA1 and a second component area EA2. The first component area EA1 and the second component area EA2 may be at least partly surrounded by the display area DA. The first component area EA1 and the second component area EA2 are shown to be spaced from each other, and without being limited thereto, at least part thereof may be connected to each other. The first component area EA1 and the second component area EA2 may represent regions below which components using infrared rays, visible rays, or sound are disposed.

The display area DA may include light emitting elements and pixel circuits for generating light emitting currents and transmitting the same to the light emitting elements. Here, one light emitting element and one pixel circuit may form a pixel PX. One pixel circuit and a corresponding one light emitting element may be formed in the display area DA for each pixel PX.

The first component area EA1 may include a region of a transparent layer for transmitting light in which no conductive layer or semiconductor layer is positioned therein. The first component area EA1 also may include a pixel defining layer including a light blocking material and a light blocking layer including openings overlapping a position that corresponds to the first component area EA1, causing a configuration that does not block light.

The second component area EA2 may include a transmission part through which light or/and sound transmit and a display part including pixels. The transmission part may be positioned between adjacent pixels and may include a transparent layer through which light or/and sound transmit. The display part may be formed by combining the pixels, and the transmission part may be positioned between the adjacent unit structure. The display part of the second component area may have a same configuration as the display area DA.

Referring to FIG. 3, the display panel DP may further include a touch sensor TS in addition to the display area DA including display pixels. The display panel DP includes pixels for generating images and may be visible to users from the outside through the transmission area TA. The touch sensor TS may be positioned on an upper portion of the pixel, and may sense external inputs applied from the outside. The touch sensor TS may sense external inputs provided to the cover window WU.

The second peripheral area PA2 may include a bending portion. The display area DA and the first peripheral area PA1 may have a planar shape that is substantially parallel to a plane defined by the first direction DR1 and the second direction DR2, and one side of the second peripheral area PA2 may extend from the planar shape, may pass through the bending portion, and may again have a planar shape. As a result, at least part of the second peripheral area PA2 may be bent and may be assembled to be positioned on the rear side of the display area DA. Upon assembly, the at least part of the second peripheral area PA2 overlaps the display area DA in a plan view, thereby reducing the blocking area BA of the display device 1000. Depending on embodiments, the second peripheral area PA2 may not be bent.

The driver 50 may be installed in the second peripheral area PA2, and may be positioned on the bending portion or one of respective sides of the bending portion. The driver 50 may be provided in a chip form. The driver 50 may be electrically connected to the display area DA and may transmit electrical signals to the display area DA. For example, the driver 50 may provide data signals to the pixels PX disposed in the display area DA. In another example, the driver 50 may include a touch driving circuit, and may be electrically connected to the touch sensor TS disposed in the display area DA. The driver 50 may be designed to include various types of circuits in addition to the above-described circuits or provide various electrical signals to the display area DA.

A pad portion may be positioned at the end portion of the second peripheral area PA2, and the display device 1000 may be electrically connected to a flexible printed circuit board (FPCB) including a driving chip by the pad portion. The driving chip positioned on the flexible printed circuit board may include various types of driving circuits for driving the display device 1000 or a connector for supplying a power voltage. Depending on embodiments, instead of the flexible printed circuit board, a rigid printed circuit board (PCB) may be used.

The optical element ES may be disposed on a lower portion of the display panel DP, for example a rear side of the display panel DP. The optical element ES may include a first optical element ES1 overlapping the first component area EA1 and a second optical element ES2 overlapping the second component area EA2.

The first optical element ES1 may be an electronic element using light or sound. For example, the first optical element ES1 may be a sensor such as an infrared sensor for receiving light and using it, a sensor for outputting and sensing light or sound to measure distances or recognize fingerprints, a small lamp for outputting light, or a speaker for outputting sound. The electronic element using light may use various wavelengths of light such as visible light, infrared rays, and ultraviolet rays.

The second optical element ES2 may be at least one of a camera, an infrared (IR) camera, a dot projector, an IR illuminator, and a time-of-flight (ToF) sensor.

Referring to FIG. 3, the display device 1000 may include a display panel DP, a power supply module PM, a first electronic module EM1, and a second electronic module EM2. The display panel DP, the power supply module PM, the first electronic module EM1, and the second electronic module EM2 may be electrically connected to each other.

The power supply module PM may supply a power voltage for a general operation of the display device 1000. The power supply module PM may include a conventional battery module.

The first electronic module EM1 and the second electronic module EM2 may include various types of functional modules for operating the display device 1000. The first electronic module EM1 may be mounted on a motherboard electrically connected to the display panel DP, or may be mounted on an additional substrate and electrically connected to the motherboard through a connector (not shown).

The first electronic module EM1 may include a control module CM, a radio communication module TM, an image input module IIM, an acoustic input module AIM, a memory MM, and an external interface IF. Some of the modules may not be mounted on the motherboard, and may be electrically connected to the motherboard through a flexible printed circuit board connected thereto.

The control module CM may control the general operation of the display device 1000. The control module CM may be a microprocessor. For example, the control module CM may activate/deactivate the display panel DP. The control module CM may control the other modules such as the image input module IIM or the acoustic input module AIM based on the touch signal received from the display panel DP.

The radio communication module TM may transmit/receive radio signals to/from other terminals by using Bluetooth or Wi-Fi lines. The radio communication module TM may transmit/receive voice signals by using a general communication line. The radio communication module TM includes a transmitter TM1 for modulating signals and transmitting the signals, and a receiver TM2 for demodulating the received signals.

The image input module IIM may process image signals and may convert the same into image data displayable on the display panel DP. The acoustic input module AIM may receive external acoustic signals by the microphone in a recording mode or a voice recognition mode, and may convert the same into electrical voice data.

The external interface IF may function as an interface electrically connected to an external charger, a cord/cordless data port, or a card socket (e.g., a memory card or a SIM/UIM card).

The second electronic module EM2 may include an acoustic output module AOM, a light emitting module LM, a light receiving module LRM, and a camera module CMM, and at least some thereof may be positioned as optical elements ES on the bottom surface of the display area DA as shown in FIG. 1 and FIG. 2. The optical element ES may include a light emitting module LM, a light receiving module LRM, and a camera module CMM. The second electronic module EM2 may be mounted on the motherboard, may be mounted on an additional substrate and may be electrically connected to the display panel DP through a connector (not shown), or may be electrically connected to the first electronic module EM1.

The acoustic output module AOM may convert the acoustic data received from the radio communication module TM or the acoustic data stored in the memory MM and may output the converted signals.

The light emitting module LM may generate light and may output the light. The light emitting module LM may output infrared rays. For example, the light emitting module LM may include an LED element. For example, the light receiving module LRM may sense the infrared rays. The light receiving module LRM may be activated in case that the infrared rays with equal to or greater than a predetermined level are sensed. The light receiving module LRM may include a CMOS sensor. In case that the infrared rays generated by the light emitting module LM are output, they may be reflected on an external subject (e.g., a finger or a face of the user), and the reflected infrared rays may be input to the light receiving module LRM. The camera module CMM may photograph external images.

The optical element ES may additionally include a photosensor or a thermal sensor. The optical element ES may sense the external subject received through the front surface or may provide sound signals such as a voice to the outside through the front surface. The optical element ES may include elements, and may be configured in many ways depending on embodiments.

Referring to FIG. 2, the housing HM may be combined with the cover window WU. The cover window WU may be disposed on the front surface of the housing HM, for example an upper portion of the housing HM. The housing HM may be combined with the cover window WU and may provide a predetermined receiving space. The display panel DP and the optical element ES may be received in a predetermined receiving space provided between the housing HM and the cover window WU.

The housing HM may include a material with relatively great rigidity. For example, the housing HM may include glass, plastic, or metal, or may include frames and/or plates configured with a combination thereof. The housing HM may stably protect the elements of the display device 1000 received in an internal space from external impacts.

Figure 4:
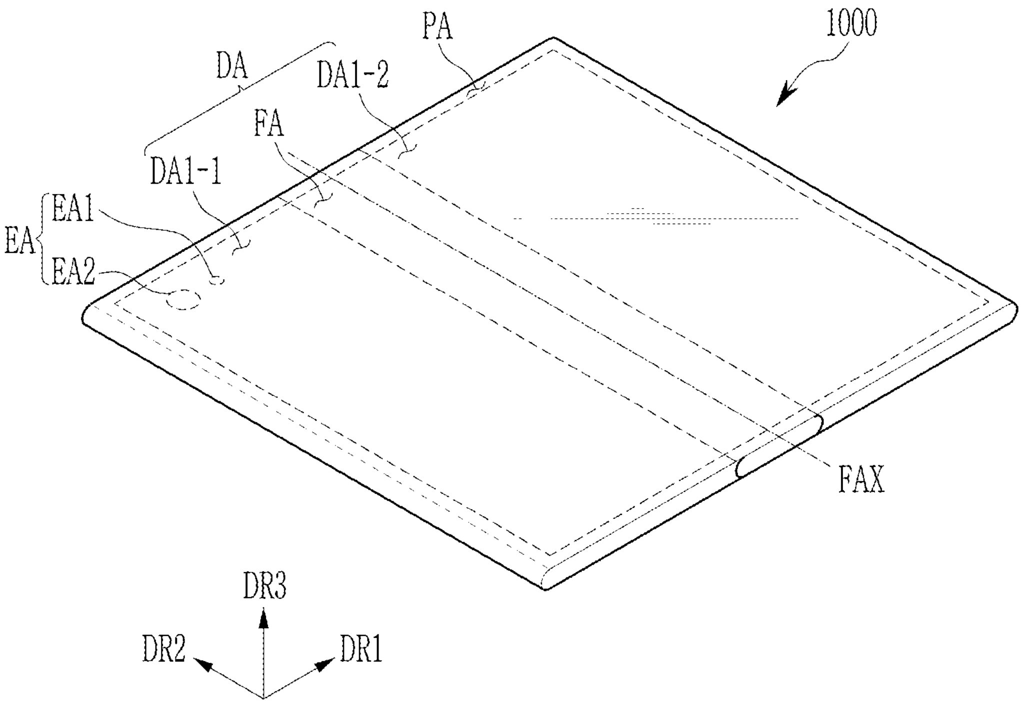
FIG. 4 shows a perspective view of a light emitting display device according to an embodiment.

A configuration of a display device 1000 according to an embodiment will now be described with reference to FIG. 4. FIG. 4 shows a perspective view of a light emitting display device according to an embodiment. No descriptions on the same constituent elements as the above-noted constituent elements will be provided, and FIG. 4 shows a foldable display device 1000 folded with respect to a folding axis FAX.

Referring to FIG. 4, the display device 1000 may be a foldable display device according to an embodiment. The display device 1000 may be folded to the inside or the outside with respect to the folding axis FAX. In case that the light emitting display device 1000 is folded to the outside with respect to the folding axis FAX, the displaying side of the light emitting display device 1000 may be positioned on the outside in the third direction DR3, and the images may be displayed in the respective directions. In case that the light emitting display device 1000 is folded to the inside with respect to the folding axis FAX, the displaying side may not be seen from the outside.

The display device 1000 may include a display area DA, a component area EA, and a non-display area PA. The display area DA may be divided into a first-1 display area DA1-1, a first-2 display area DA1-2, and a folding area FA. The first-1 display area DA1-1 and the first-2 display area DA1-2 may be positioned on the left and the right with respect to the folding axis FAX, and the folding area FA may be positioned between the first-1 display area DA1-1 and the first-2 display area DA1-2. In this instance, in case that the display device 1000 is folded to the outside with respect to the folding axis FAX, the first-1 display area DA1-1 and the first-2 display area DA1-2 may be positioned on respective sides in the third direction DR3 and may display the images in the respective directions. In case that the display device 1000 is folded to the inside with respect to the folding axis FAX, the first-1 display area DA1-1 and the first-2 display area DA1-2 may not be seen from the outside.

Figure 5:
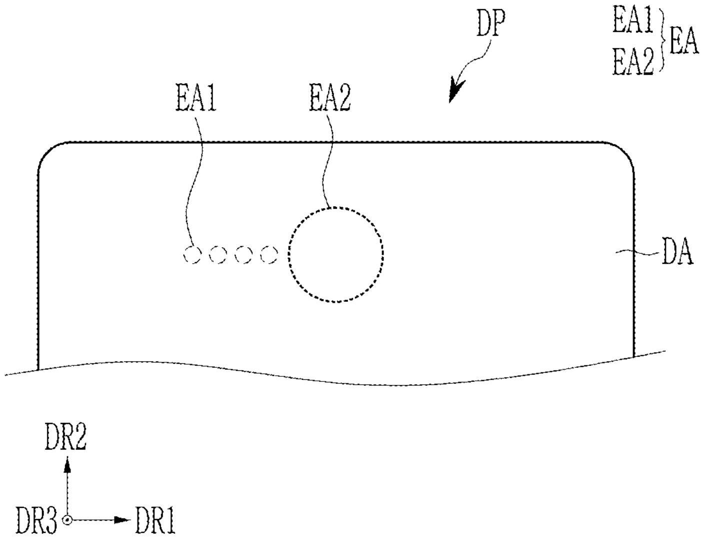
FIG. 5 shows a top plan view of an enlarged region of a display device according to an embodiment.

FIG. 5 shows a top plan view of an enlarged region of a light emitting display device according to an embodiment. FIG. 5 shows a portion of a light emitting display panel DP of a light emitting display device according to an embodiment, by using a display panel for a mobile phone.

The display area DA is positioned on the front surfaces of the light emitting display panel DP, and the component area EA is positioned in the display area DA. In detail, the component area EA may include a first component area EA1 and a second component area EA2. Additionally, in an embodiment illustrated in FIG. 5, the first component area EA1 may be positioned near the second component area EA2. In an embodiment illustrated in FIG. 5, the first component area EA1 may be positioned on a left on the second component area EA2. The position and the number of the first component area EA1 may be variable depending on embodiments. Referring to FIG. 2 and FIG. 5, the second optical element ES2 that corresponds to the second component area EA2 may be a camera, and the first optical element ES1 that corresponds to the first component area EA1 may be an optical sensor.

The display area DA may include light-emitting devices, and pixel circuit portions for generating a light emitting current and transmitting the same to the respective light-emitting devices. Here, one light-emitting device and one pixel circuit portion can form a pixel PX. One pixel circuit portion and one light-emitting device are disposed one-to-one in the display area DA.

Figure 6A:
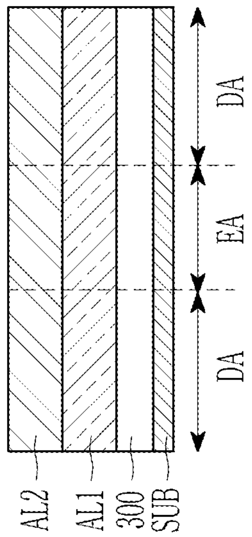
FIGS. 6A and 6B show a schematic cross-sectional view of a display panel according to an embodiment.
Figure 6B:
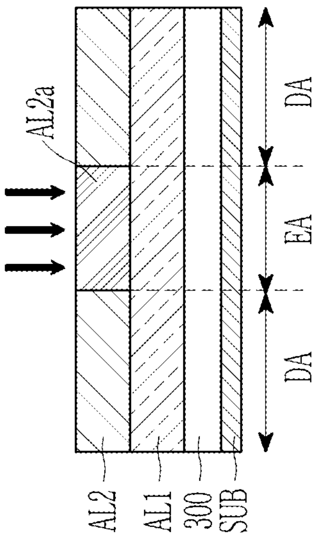

FIGS. 6A and 6B show a schematic cross-sectional view of a display panel according to an embodiment.

Referring to FIG. 6A, the display panel DP may include a display area DA and a component area EA. The component area EA may include a first component area EA1 and a second component area EA2. The component area EA may be positioned inside the display area DA.

The display panel DP may include a substrate SUB, a display layer 300, a capping layer AL1, and a low reflection layer AL2.

The display layer 300 may include a transistor positioned on the substrate SUB, and a light-emitting device electrically connected to the transistor. The light-emitting device may include a light emitting diode, for example, an organic light emitting diode including an organic emission layer.

A capping layer AL1 may be positioned on the display layer 300. The capping layer AL1 may increase light emitting efficiency of the light-emitting device ED according to a principle of constructive interference. The capping layer AL1 may be an organic capping layer including an organic material, an inorganic capping layer including an inorganic material, or a complex capping layer including an organic material and an inorganic material.

A first low reflection layer AL2 may be positioned on the capping layer AL1. The first low reflection layer AL2 may include an inorganic material with low reflectance, and it may exemplarily include a metal. For example, the first low reflection layer AL2 may include bismuth (Bi), ytterbium (Yb), cobalt (Co), molybdenum (Mo), tin (Sn), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), or a combination thereof.

The first low reflection layer AL2 may reduce reflectance of external light by inducing destructive interference between light input into the display device and light reflected from the metal disposed on a lower portion of the first low reflection layer AL2. Therefore, the first low reflection layer AL2 may increase display quality and visibility of the display device by reducing the reflectance of external light of the display device.

Referring to FIG. 6B, in case that the first low reflection layer AL2 is formed, the first low reflection layer AL2 overlapping the component area EA may undergo an oxidation treatment based on applying laser beams that may result in formation of a second low reflection layer AL2*a*. The second low reflection layer AL2*a* may be positioned on the capping layer AL1 and may overlap the component area EA. The laser beams used for the oxidation treatment may have energy that is lower than the laser beams used to a laser lift off aiming at separation.

The second low reflection layer AL2*a* having undergone the oxidation treatment by laser beams may include an inorganic oxide. For example, the second low reflection layer AL2*a* may include $Bi_2O_3$, $MoO_2$, $MoO_3$, $Ta_2O_5$, $NbO_2$, $SnO_2$, $ZrO_2$, $HfO_2$, $F_2O_3$, ZnO, ITO, CdO, $SiO_2$, $TiO_2$, $Al_2O_3$, $Y_2O_3$, BeO, MgO, $PbO_2$, $WO_3$, SiNx, LiF, $CaF_2$, $MgF_2$, CdS, or combinations thereof.

For example, in case that a bismuth (Bi) layer is made of the first low reflection layer AL2, the second low reflection layer AL2*a* overlapping the component area EA may include a bismuth oxide ($Bi_xO_y$) layer generated by performing an oxidation treatment to the bismuth (Bi) layer. The bismuth oxide ($Bi_xO_y$) layer may have a lower absorption coefficient k than the bismuth layer Bi. For example, the absorption coefficient k of the bismuth (Bi) is 2.66, and the absorption coefficient k of the bismuth oxide ($Bi_2O_3$) after undergoing the oxidation treatment may be reduced to 0.03.

Table 1 expresses the absorption coefficients k before/after metal materials undergo the oxidation treatment.

TABLE 1

| Metals | Absorption coefficient k | After oxidation treatment | Absorption coefficient k |
|---|---|---|---|
| Bi | 2.66 | $Bi_2O_3$ | 0.03 |
| Mo | 3.7 | $MoO_2$ | 0.68 |
| Mo | | $MoO_3$ | 0.01 |
| Sn | 4.12 | $SnO_2$ | 0.03 |
| Zn | 4.98 | ZnO | 0.01 |
| Zr | 1.53 | $ZrO_2$ | 0 |

Table 1 demonstrates that the absorption coefficient k is substantially reduced in case that the metal undergoes the oxidation treatment. As the absorption coefficient k represents the coefficient on degrees of absorbing light, the absorption coefficient k is inversely proportional to transmittance of light, and the transmittance of light may increase as the material has the lower absorption coefficient k. The absorption coefficient k of the metal is reduced in case that it undergoes the oxidation treatment, and the transmittance may be accordingly increased. In an embodiment, transmittance of the second low reflection layer AL2*a* overlapping the component area EA may be increased as the metal layer includes a metal oxide having undergone the oxidation treatment.

The oxidation treatment on the second low reflection layer AL2*a* by laser beams has been described, as another example the oxidation treatment may be implemented using a photolithography process. For example, an insulating layer may be formed on the first low reflection layer AL2; the insulating layer may be patterned to expose the first low reflection layer AL2 overlapping the component area EA, and an oxygen doping process or a plasma process may be applied to form the second low reflection layer AL2*a* having undergone the oxidation treatment.

Figure 7A:
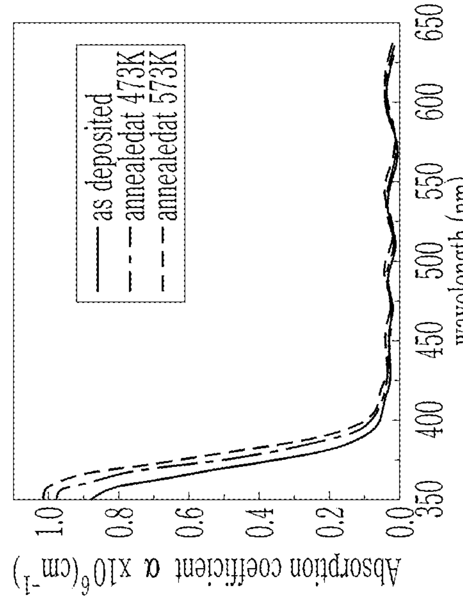
FIGS. 7A-7D show respective correlations of absorption coefficients k of materials and transmittance.
Figure 7B:
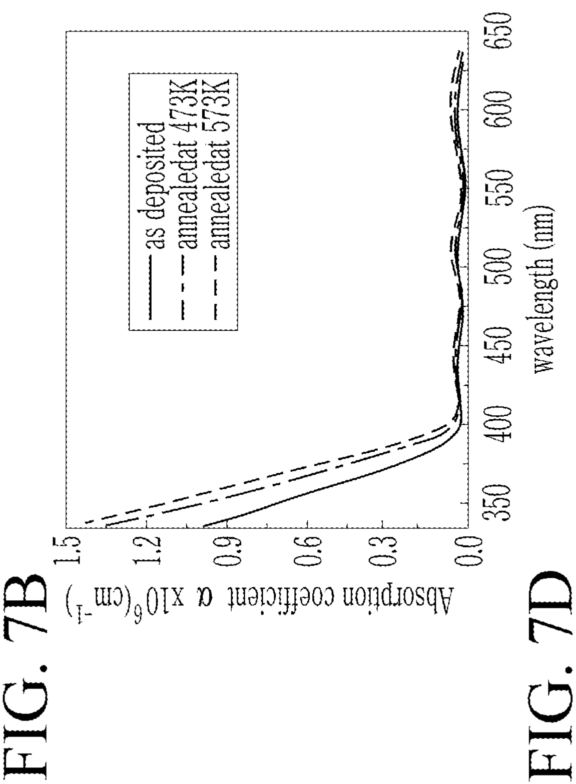
Figure 7C:
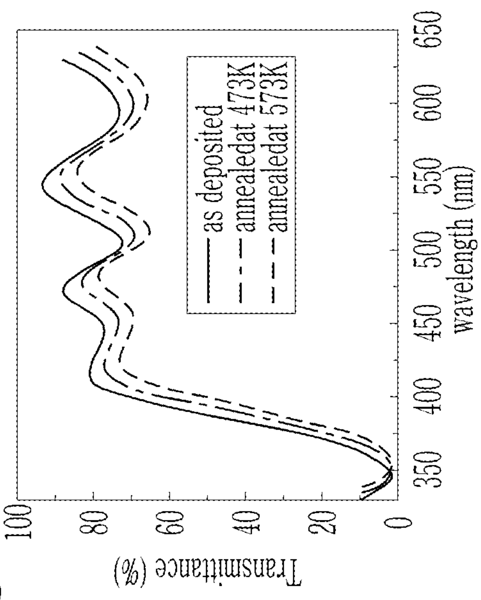

FIGS. 7A-7C show respective correlations of absorption coefficients k of materials and transmittance.

FIG. 7A shows a graph of the absorption coefficient k of a cadmium oxide (CdO) with respect to wavelength regions, and FIG. 7C shows a graph of the transmittance of a cadmium oxide (CdO) with respect to wavelength regions. The respective graphs shown in FIG. 7A and FIG. 7C show a case that the cadmium oxide (CdO) is not annealed, a case that it is annealed at the temperature of 473 K, and a case that it is annealed at the temperature of 573 K.

A comparison of FIG. 7A with FIG. 7C shows that the absorption coefficient k of the cadmium oxide (CdO) is substantially lowered at the wavelength bandwidth of 400 nm, the transmittance is substantially increased at the wavelength bandwidth of 400 nm, and that the absorption coefficient k and the transmittance are inversely proportional to each other.

Figure 7D:
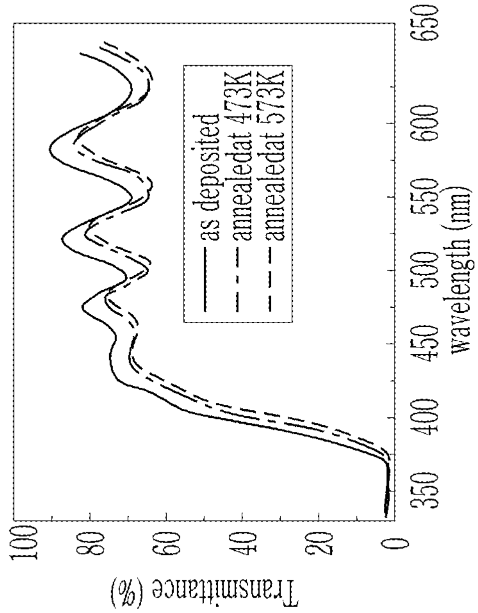

FIG. 7B shows a graph of the absorption coefficient k of the zinc oxide (ZnO) with respect to the wavelength regions, and FIG. 7D shows a graph of the transmittance of the zinc oxide (ZnO) with respect to the wavelength regions. The respective graphs shown in FIG. 7B and FIG. 7D show a case that the zinc oxide (ZnO) is not annealed, a case that it is annealed at the temperature of 473 K, and a case that it is annealed at the temperature of 573 K.

A comparison of FIG. 7B with FIG. 7D shows that the absorption coefficient k of the zinc oxide (ZnO) is substantially lowered at the wavelength bandwidth of 400 nm, the transmittance is substantially increased at the wavelength bandwidth of 400 nm, and that the absorption coefficient k and the transmittance are inversely proportional to each other.

Figure 8:
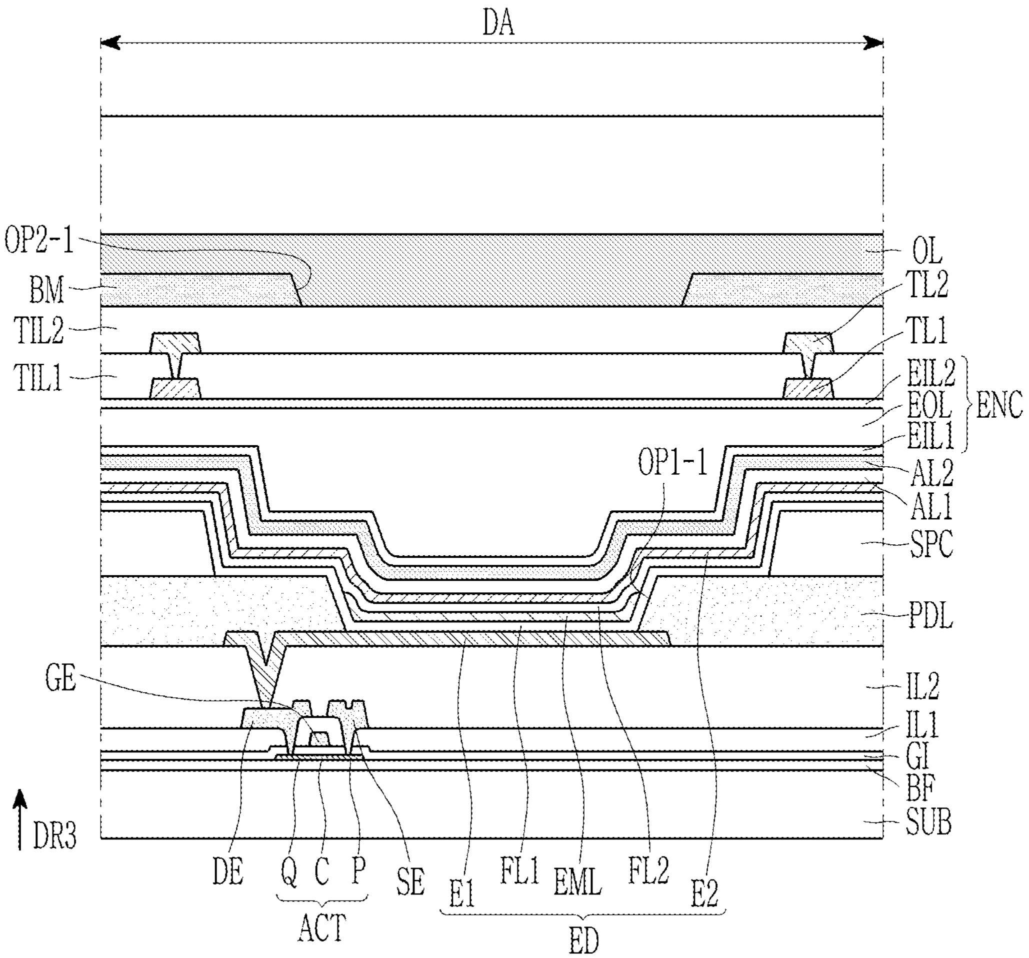
FIG. 8 shows a schematic cross-sectional view of a display area according to an embodiment.
Figure 9:
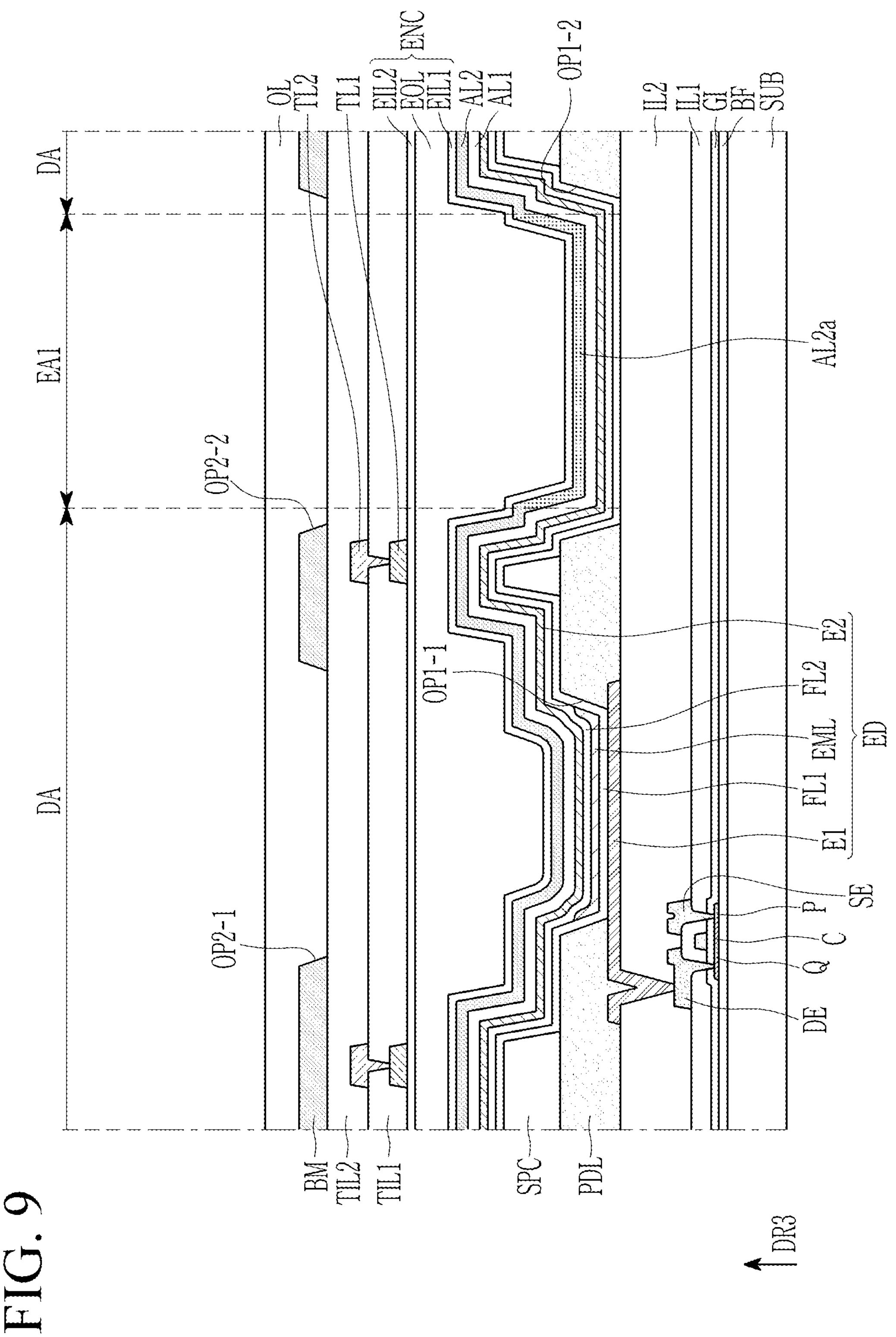
FIG. 9 shows a schematic cross-sectional view of a first component area according to an embodiment.
Figure 10:
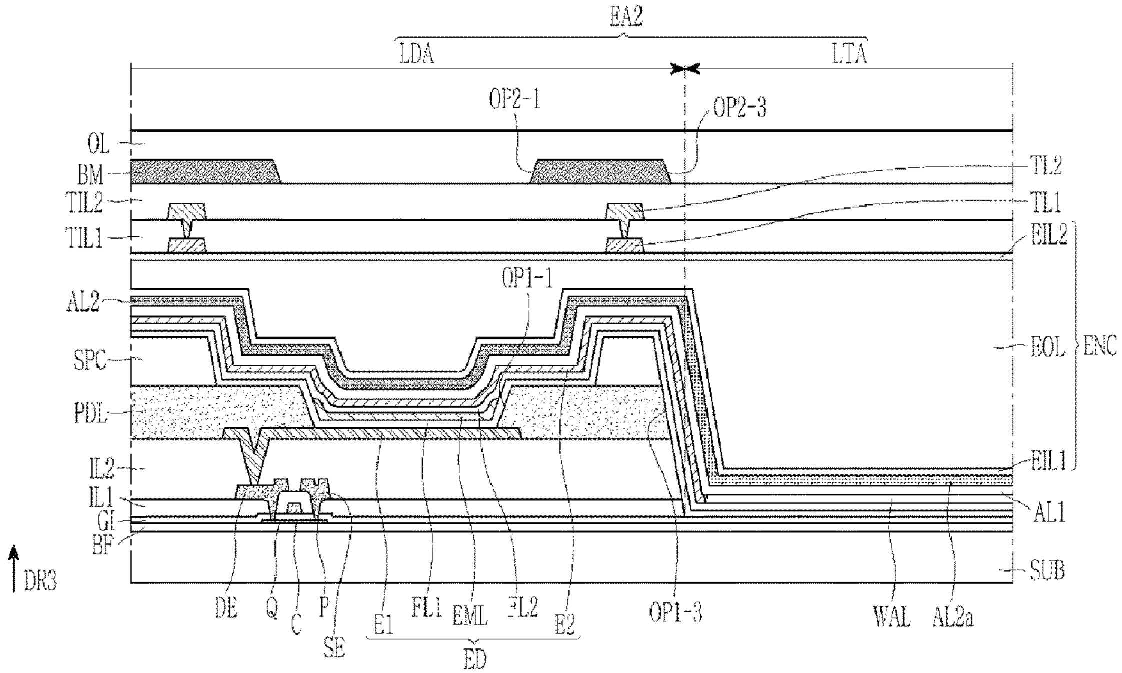
FIG. 10 shows a schematic cross-sectional view of a second component area according to an embodiment.

A display panel according to an embodiment will now be described with reference to FIG. 8 to FIG. 10. FIG. 8 shows a schematic cross-sectional view of constituent elements disposed in a display area according to an embodiment, FIG. 9 shows a schematic cross-sectional view of constituent elements disposed in a display area and a first component area according to an embodiment, and FIG. 10 shows a schematic cross-sectional view of constituent elements disposed in a second component area according to an embodiment.

FIG. 8 shows a schematic cross-sectional view of a display area DA according to an embodiment.

The display panel includes a substrate SUB. The substrate SUB may include an inorganic insulating material such as glass or an organic insulating material such as plastic that is like a polyimide (PI). The substrate SUB may be a single layer or a multilayer. The substrate SUB may have a structure in which at least one base layer including sequentially stacked polymer resins and at least one inorganic layer may be alternately stacked each other.

The substrate SUB may have various degrees of flexibility. The substrate SUB may be a rigid substrate or a bending, folding, or rolling flexible substrate.

A buffer layer BF may be positioned on the substrate SUB. The buffer layer BF may prevent characteristic degradation of the semiconductor layer ACT and stresses by preventing impurities from being transmitted to the upper layer of the buffer layer BF, for example the semiconductor layer ACT, from the substrate SUB. The buffer layer BF may include an inorganic insulating material or organic insulating material, such as a silicon nitride or a silicon oxide. Part or all of the buffer layer BF may be omitted.

A semiconductor layer ACT may be positioned on the buffer layer BF. The semiconductor layer ACT may include at least one of polysilicon and an oxide semiconductor. The semiconductor layer ACT includes a channel region C, a first region P, and a second region Q. The first region P and the second region Q are disposed on respective sides of the channel region C. The channel region C includes a semiconductor to which a small amount of impurities are/are not doped, and the first region P and the second region Q may include a semiconductor to which a large amount of impurities are doped compared to the channel region C. The semiconductor layer ACT may be made of an oxide semiconductor, and a protection layer (not shown) for protecting an oxide semiconductor material that is weak to external conditions such as a high temperature may be added thereto.

A gate insulating layer GI may be positioned on the semiconductor layer ACT. The gate insulating layer GI may be a single layer or a multilayer including at least one of a silicon oxide (SiOx), a silicon nitride (SiNx), and/or a silicon oxynitride (SiOxNy).

A gate electrode GE may be positioned on the gate insulating layer GI. The gate electrode GE may be a single layer or a multilayer on which a metal film including one of copper (Cu), a copper alloy, aluminum (Al), an aluminum alloy, molybdenum (Mo), a molybdenum alloy, titanium (Ti), and/or a titanium alloy is stacked each other. The gate electrode GE may overlap and face the channel region C of the semiconductor layer ACT.

A first insulating layer IL1 may be positioned on the gate electrode GE and the gate insulating layer GI. The first insulating layer IL1 may be a single layer or a multilayer including at least one of a silicon oxide (SiOx), a silicon nitride (SiNx), and/or a silicon oxynitride (SiOxNy).

A source electrode SE and a drain electrode DE may be positioned on the first insulating layer ILL The source electrode SE and the drain electrode DE may be respectively electrically connected to the first region P and the second region Q of the semiconductor layer ACT through a contact hole formed in the first insulating layer ILL The source electrode SE and the drain electrode DE may include aluminum (Al), silver (Ag), magnesium (Mg), gold (Au), nickel (Ni), chromium (Cr), nickel (Ni), calcium (Ca), molybdenum (Mo), titanium (Ti), tungsten (W), and/or copper (Cu), and may be a single layer or a multilayer including the same.

A second insulating layer IL2 may be positioned on the first insulating layer Ill, the source electrode SE, and the drain electrode DE. The second insulating layer IL2 may include an organic insulating material such as a general-purpose polymer such as poly(methyl methacrylate) (PMMA) or polystyrene (PS), a polymer derivative having a phenol-based group, an acryl-based polymer, an imide-based polymer, a polyimide, an acryl-based polymer, and/or a siloxane-based polymer. The disclosure shows a single-layered second insulating layer IL2, and without being limited thereto, as it may be formed as multiple layers.

A first electrode E1 may be positioned on the second insulating layer IL2. The first electrode E1 may be electrically connected to the drain electrode DE through a contact hole of the second insulating layer IL2.

The first electrode E1 may include a metal such as silver (Ag), lithium (Li), calcium (Ca), aluminum (Al), magnesium (Mg), and/or gold (Au), and may include a transparent conductive oxide (TCO) such as an indium tin oxide (ITO) or an indium zinc oxide (IZO). The first electrode E1 may be a single layer including a metal material or a transparent conductive oxide or a multilayer including them. For example, the first electrode E1 may have a triple-layered structure of indium tin oxide (ITO)/silver (Ag)/indium tin oxide (ITO).

The transistor made of the gate electrode GE, the semiconductor layer ACT, the source electrode SE, and the drain electrode DE may be electrically connected to the first electrode E1 and may supply a current to the light-emitting device.

A pixel defining layer PDL may be positioned on the second insulating layer IL2 and the first electrode E1.

The pixel defining layer PDL may overlap and face at least part of the first electrode E1 and may have a first-1 opening OP1-1 for defining a light emitting region. For example, a surface of the pixel defining layer PDL may contact a corresponding surface of the first electrode E1.

The pixel defining layer PDL may include an organic insulator. In another example, the pixel defining layer PDL may include an inorganic insulating material such as a silicon nitride, a silicon oxynitride, and/or a silicon oxide. In another example, the pixel defining layer PDL may include an organic insulator and an inorganic insulating material. The pixel defining layer PDL may include a light blocking material and may be made black. The light blocking material may include a resin and/or a paste including carbon black, carbon nanotubes, a black dye, metal particles, for example, nickel, aluminum, molybdenum, and/or an alloy thereof, metal oxide particles (e.g., a chromium oxide), and/or metal nitride particles (e.g., a chromium nitride). In case that the pixel defining layer PDL includes a light blocking material, reflection of external light by metallic structures disposed on a lower side of the pixel defining layer PDL may be reduced. In another example, the pixel defining layer PDL may include no light blocking material and may include a light-transmitting organic insulator.

A spacer SPC may be disposed on the pixel defining layer PDL. The spacer SPC may include an organic insulator such as a polyimide. In another example, the spacer SPC may include an inorganic insulating material such as a silicon nitride ($SiN_x$) and/or silicon dioxide ($SiO_2$), or may include an organic insulator and an inorganic insulating material.

The spacer SPC may include a same material as the pixel defining layer PDL. The pixel defining layer PDL and the spacer SPC may be formed in a mask process using a halftone mask. The pixel defining layer PDL and the spacer SPC may include different materials.

An emission layer EML may be positioned on the first electrode E1. The emission layer EML may include an organic material and/or an inorganic material. The emission layer EML may generate predetermined colored light. The emission layer EML may use a mask or an inkjet process to be formed and positioned in the first-1 opening OP1-1 of the pixel defining layer.

A first functional layer FL1 may be positioned between the emission layer EML and the first electrode E1, and a second functional layer FL2 may be positioned between the emission layer EML and the second electrode E2.

The first functional layer FL1 may include at least one of a hole injection layer (HIL) and a hole transporting layer (HTL), and the second functional layer FL2 may include at least one of an electron transporting layer (ETL) and/or an electron injection layer (EIL).

While the emission layer EML is disposed on respective pixels to correspond to the opening OP1-1 of the pixel defining layer PDL, the first functional layer FL1 and second functional layer FL2 may be integrally formed to respectively entirely cover the substrate SUB. The first functional layer FL1 and the second functional layer FL2 may entirely cover the display area DA of the substrate SUB.

A second electrode E2 may be positioned on the emission layer EML. The second electrode E2 may include a reflective metal such as calcium (Ca), barium (Ba), magnesium (Mg), aluminum (Al), silver (Ag), gold (Au), nickel (Ni), chromium (Cr), lithium (Li), calcium (Ca), and/or molybdenum (Mo), and/or a transparent conductive oxide (TCO) such as an indium tin oxide (ITO) or an indium zinc oxide (IZO).

The first electrode E1, the emission layer EML, and the second electrode E2 may form the light-emitting device ED. Here, the first electrode E1 may be an anode that is a hole injecting electrode, and the second electrode E2 may be a cathode that is an electron injecting electrode. Depending on embodiments, the first electrode E1 may be a cathode, and the second electrode E2 may be an anode.

Holes and electrons may be respectively injected into the emission layer EML from the first electrode E1 and the second electrode E2, and light may emit in case that excitons that are a combination of the injected holes and electrons fall to a ground state from an excited state.

A capping layer AL1 may be positioned on the second electrode E2. The capping layer AL1 may increase the light emitting efficiency of the light-emitting device ED according to the constructive interference. The capping layer AL1 may be an organic capping layer including an organic material, an inorganic capping layer including an inorganic material, or a complex capping layer including an organic material and an inorganic material. For example, the capping layer AL1 may include a carbocyclic compound, a heterocyclic compound, an amine group-contained compound, porphine derivatives, phthalocyanine derivatives, naphthalocyanine derivatives, an alkali metal complex, an alkali earth metal complex, and/or their arbitrary combinations.

The reflectance compound, the heterocyclic compound, and the amine group-contained compound may be selectively substituted with substituents including O, N, S, Se, Si, F, Cl, Br, I, and/or their arbitrary combinations.

A first low reflection layer AL2 may be disposed on the capping layer ALL As the capping layer AL1 may be disposed on the light-emitting device ED, the first low reflection layer AL2 may be disposed on the light-emitting device ED. The first low reflection layer AL2 may overlap and face the front surface of the substrate SUB.

The first low reflection layer AL2 may include an inorganic material with low reflectance, and may include a metal according to an embodiment. For example, the first low reflection layer AL2 may include bismuth (Bi), ytterbium (Yb), cobalt (Co), molybdenum (Mo), tin (Sn), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), and/or combinations thereof.

The absorption coefficient k of the inorganic material included in the first low reflection layer AL2 may be equal to or greater than 1.5 ($k \geq 1.5$). The inorganic material included in the first low reflection layer AL2 may have a refractive index (n) of equal to or greater than 1 ($n \geq 1.0$). The first low reflection layer AL2 may have a thickness of 1 nm to 100 nm.

The first low reflection layer AL2 may reduce the reflectance of external light by inducing destructive interference between light input inside the display device and light reflected from the metal disposed on a lower portion of the first low reflection layer AL2. Therefore, display quality and visibility of the display device may be increased by reducing the reflectance of external light of the display device through the first low reflection layer AL2.

An encapsulation layer ENC may be positioned on the first low reflection layer AL2. The encapsulation layer ENC may cover an upper portion and a lateral side of the light-emitting device and may seal the same. The light-emitting device may become weakened due to moisture and oxygen, hence the encapsulation layer ENC seals the light-emitting device to block inflow of external moisture and oxygen.

The encapsulation layer ENC may include an inorganic layer and an organic layer, for example, in sequential order a first encapsulation inorganic layer EIL1, an encapsulation organic layer EOL, and a second encapsulation inorganic layer EIL2.

The first encapsulation inorganic layer EIL1 may cover the second electrode E2. The first encapsulation inorganic layer EIL1 may prevent external moisture or oxygen from permeating into the light-emitting device. For example, the first encapsulation inorganic layer EIL1 may include a silicon nitride, a silicon oxide, a silicon oxynitride, and/or combined compounds thereof. The first encapsulation inorganic layer EIL1 may be formed by a deposition process.

The encapsulation organic layer EOL may be disposed on the first encapsulation inorganic layer EIL1 and may contact the first encapsulation inorganic layer ETU. Curves formed on an upper side of the first encapsulation inorganic layer EIL1 or particles provided on the first encapsulation inorganic layer EIL1 may be covered by the encapsulation organic layer EOL, preventing and blocking any adverse effects on a surface state of the upper side of the first encapsulation inorganic layer EIL1 applied to constituent elements formed on the encapsulation organic layer EOL. The encapsulation organic layer EOL may ease a stress between contacting layers. The encapsulation organic layer EOL may include an organic material, and may be formed according to a solution process such as a spin coating, a slit coating, or an inkjet process.

The second encapsulation inorganic layer EIL2 may be disposed on the encapsulation organic layer EOL to cover the encapsulation organic layer EOL. The second encapsulation inorganic layer EIL2 may be stably formed on a relative more planar side than on the first encapsulation inorganic layer ETU. The second encapsulation inorganic layer EIL2 may encapsulate the moisture discharged from the encapsulation organic layer EOL to prevent the same from being introduced to the outside. The second encapsulation inorganic layer EIL2 may include a silicon nitride, a silicon oxide, a silicon oxynitride, and/or combined compound thereof. The second encapsulation inorganic layer EIL2 may be formed according to a deposition process.

A first conductive layer TL1, a first touch insulating layer TILL a second conductive layer TL2, and a second touch insulating layer TIL2 may be positioned on the encapsulation layer ENC. The first conductive layer TL1, the first touch insulating layer TILL, the second conductive layer TL2, and the second touch insulating layer TIL2 may form the touch sensor TS described with reference to FIG. 3.

The first conductive layer TL1 may be disposed on the encapsulation layer ENC. The first conductive layer TL1 may be disposed on the second encapsulation inorganic layer EIL2 of the encapsulation layer ENC. However, the disclosure is not limited thereto.

The display device may include an insulating layer (not shown) disposed between the first conductive layer TL1 and the encapsulation layer ENC. The insulating layer may be disposed on the second encapsulation inorganic layer EIL2 of the encapsulation layer ENC to planarize the side on which the first conductive layer TL1 is disposed. The first conductive layer TL1 may be disposed on the insulating layer. The insulating layer may include an inorganic insulator such as a silicon oxide ($SiO_2$), a silicon nitride ($SiN_x$), and/or a silicon oxynitride ($SiO_xN_y$). In another example, the insulating layer may include an organic insulator.

In an embodiment, a first touch insulating layer TIL1 may be disposed on the first conductive layer TL1. The first touch insulating layer TIL1 may be made of an inorganic material or an organic material. In case that the first touch insulating layer TIL1 is made of an inorganic material, the first touch insulating layer TIL1 may include at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and/or a silicon oxynitride. In case that the first touch insulating layer TIL1 is made of an organic material, the first touch insulating layer TIL1 may include at least one of an acryl-based resin, a methacryl-based resin, polyisoprene, a vinyl-based resin, an epoxy-based resin, a urethane-based resin, a cellulose-based resin, and a perylene-based resin.

In an embodiment, a second conductive layer TL2 may be disposed on the first touch insulating layer TILL The second conductive layer TL2 may function as a sensor for sensing touch inputs of a user. The first conductive layer TL1 may function as a connector for connecting the patterned second conductive layer TL2 in one direction. The first conductive layer TL1 and the second conductive layer TL2 may function as sensors. The first conductive layer TL1 and the second conductive layer TL2 may be electrically connected to each other through a contact hole. As the first conductive layer TL1 and the second conductive layer TL2 function as sensors, resistance of the touch electrode may be reduced, and they may readily sense the touch inputs of the user.

In an embodiment, the first conductive layer TL1 and the second conductive layer TL2 may have, for example, a mesh structure so that light emitted by the light-emitting device ED may pass through. Here, the first conductive layer TL1 and the second conductive layer TL2 may be disposed so that they may not overlap the emission layer EML.

The first conductive layer TL1 and the second conductive layer TL2 may include a metal layer or a transparent conductive layer. The metal layer may include molybdenum (Mo), silver (Ag), titanium (Ti), copper (Cu), aluminum (Al), and/or alloys thereof. The transparent conductive layer may include a transparent conductive oxide such as an indium tin oxide (ITO), an indium zinc oxide (IZO), a zinc oxide (ZnO), and an indium tin zinc oxide (ITZO). In addition, the transparent conductive layer may include a conductive polymer such as PEDOT, metal nanowires, carbon nanotubes, and/or graphene.

In an embodiment, a second touch insulating layer TIL2 may be disposed in the second conductive layer TL2. The second touch insulating layer TIL2 may include an inorganic material or an organic material. In case that the second touch insulating layer TIL2 includes an inorganic material, the second touch insulating layer TIL2 may include at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and/or a silicon oxynitride. In case that the second touch insulating layer TIL2 includes an organic material, the second touch insulating layer TIL2 may include at least one of an acryl-based resin, a methacryl-based resin, polyisoprene, a vinyl-based resin, an epoxy-based resin, a urethane-based resin, a cellulose-based resin, and/or a perylene-based resin.

A light blocking layer BM may be positioned on the second touch insulating layer TIL2. The light blocking layer BM may include a second-1 opening OP2-1 overlapping an emission layer EML. The light blocking layer BM may overlap and face at least part of the pixel defining layer PDL.

A reflection adjusting layer OL may be disposed on the light blocking layer BM. The reflection adjusting layer OL may selectively absorb light with a wavelength in a predetermined bandwidth from among the light reflected from the inside of the display device or the light input from the outside of the display device. The reflection adjusting layer OL may fill openings among the light blocking layer BM.

For example, the reflection adjusting layer OL may absorb a first wavelength region of 490 nm to 505 nm and a second wavelength region of 585 nm to 600 nm to allow the light transmittance of the first wavelength region and the second wavelength region to be equal to or less than 40%. The reflection adjusting layer OL may absorb light with a wavelength digressing from the light emitting wavelength range of red, green, or blue emitted by the light-emitting device ED. As described, the reflection adjusting layer OL may absorb light with a wavelength that does not belong to the wavelength range of red, green, or blue emitted by the light-emitting device, thereby preventing luminance of the display device from being reduced or minimizing the reduction of luminance, preventing light emitting efficiency of the display device from being deteriorated or minimizing the deterioration of the light emitting efficiency, and increasing visibility.

In an embodiment, the reflection adjusting layer OL may be made of an organic material layer including a dye, a pigment, or a combination thereof. The reflection adjusting layer OL may include a tetraazaporphyrin (TAP)-based compound, a porphyrin-based compound, a metal porphyrin-based compound, an oxazine-based compound, a squarylium-based compound, a triarylmethane-based compound, a polymethine-based compound, an anthraquinone-based compound, a phthalocyanine-based compound, an azo-based compound, a perylene-based compound, a xanthene-based compound, a diammonium-based compound, a dipyrromethene-based compound, a cyanine-based compound, and/or combinations thereof.

The reflectance measured on the surface of the reflection adjusting layer OL in a specular component included (SCI) mode may be equal to or less than 10%. The visibility may be increased in case that the reflection adjusting layer OL absorbs the reflection of external light of the display device. The transmittance of the reflection adjusting layer OL may be adjusted according to a content of the pigment and/or the dye included in the reflection adjusting layer OL.

As the display device includes the first low reflection layer AL2 and the reflection adjusting layer OL to reduce the reflection of external light, it may not use an additional polarization film.

A stacking structure of the first component area EA1 will now be described with reference to FIG. 9. Planar and schematic cross-sectional configurations on the display area DA correspond to what is described with reference to FIG. 8 so they will be omitted. The first component area EA1 will now be described.

The first component area EA1 is formed with transparent layers so that light may transmit through, and no conductive layer or semiconductor layer may be positioned therein. The pixel defining layer including a light blocking material and the light blocking layer may include an opening overlapping the position that corresponds to the first component area EA1 to thus have a configuration that does not block light.

The first component area EA1 may include a buffer layer BF, a gate insulating layer GI, a first insulating layer ILL and a second insulating layer IL2 disposed on the substrate SUB.

The pixel defining layer PDL may include a first-2 opening OP1-2 overlapping the first component area EA1. The pixel defining layer PDL including a light blocking material may not overlap the first component area EA1 and may be spaced from the same.

The first component area EA1 may include a first functional layer FL1, a second functional layer FL2, a second electrode E2, a capping layer AL1, a low reflection layer AL2, and an encapsulation layer ENC disposed on the second insulating layer IL2.

The first low reflection layer AL2 may include an inorganic material in the display area DA, and the second low reflection layer AL2*a* may include an inorganic oxide in the first component area EA1.

The first low reflection layer AL2 may be deposited on the capping layer AL1, and the oxidation treatment may be applied to at least a portion of the first low reflection layer AL2 positioned in the region overlapping the first component area EA1 to form a second low reflection layer AL2*a* in a same layer as the first low reflection layer AL2; hence, the first low reflection layer AL2 and the second low reflection layer AL2*a* may be disposed in a same layer. For example, the first low reflection layer AL2 of the first component area EA1 may be patterned to be exposed by using a photolithography process, and an oxygen doping process or a plasma process may be performed to form a second low reflection layer AL2*a*. In another example, the second low reflection layer AL2*a* may be formed by irradiating laser beams to the first low reflection layer AL2 overlapping the first component area EA1.

The second low reflection layer AL2*a* positioned in the first component area EA1 may include, for example, $Bi_2O_3$, $MoO_2$, $MoO_3$, $Ta_2O_5$, $NbO_2$, $SnO_2$, $ZrO_2$, $HfO_2$, $F_2O_3$, ZnO, ITO, CdO, $SiO_2$, $TiO_2$, $Al_2O_3$, $Y_2O_3$, BeO, MgO, $PbO_2$, $WO_3$, SiNx, LiF, $CaF_2$, $MgF_2$, CdS, and/or combinations thereof. The absorption coefficient k of the inorganic oxide included in the second low reflection layer AL2*a* positioned in the first component area EA1 may be equal to or less than 0.5 ($k \leq 0.5$). Further, a thickness of the second low reflection layer AL2*a* may be about 1 nm to about 100 nm.

An encapsulation layer ENC may be positioned on the first and second low reflection layers AL2 and AL2*a*. The first touch insulating layer TIL1 and the second touch insulating layer TIL2 may be positioned on the encapsulation layer ENC. The first conductive layer TL1 and the second conductive layer TL2 included by the touch sensor may not overlap the first component area EA1.

A second-2 opening OP2-2 included by the light blocking layer BM may be positioned on the second touch insulating layer TIL2. The first component area EA1 may overlap the second-2 opening OP2-2 of the light blocking layer BM. The first component area EA1 may not overlap the light blocking layer BM.

The reflection adjusting layer OL may be disposed on the light blocking layer BM. The reflection adjusting layer OL may selectively absorb light with a wavelength in a predetermined bandwidth from among the light reflected from the inside of the display device or the light input from the outside of the display device. The reflection adjusting layer OL may fill openings among the light blocking layer BM.

The reflection adjusting layer OL may be made of an organic material layer including a dye, a pigment, and/or a combination thereof. The reflection adjusting layer OL may absorb reflection of external light of the display device and may increase visibility. The transmittance of the reflection adjusting layer OL may be adjusted according to a content of the pigment and/or the dye included in the reflection adjusting layer OL.

A stacking configuration of a second component area EA2 will now be described with reference to FIG. 10. Descriptions of the same elements as the above-noted elements will not be provided.

The second component area EA2 includes a display part LDA on which pixels are disposed and a transmission part LTA. The configuration of the display part LDA of the second component area EA2 may correspond to the configuration of the display area DA. The description on the region in which the light-emitting device ED is positioned from among planar and schematic cross-sectional configurations of the display part LDA corresponds to the above-described content and will not be repeated below.

The transmission part LTA will now be described. The second component area EA2 may include the transmission part LTA and may have light transmittance that is relatively higher than the display area DA. The optical element ES2 illustrated in FIG. 2 may be disposed on a rear side of the substrate SUB and overlapping the second component area EA2 such that the second component area EA2 may be positioned on the front surface of the second optical element ES2. The second component area EA2 may include the display part LDA including pixels, and the transmission part LTA disposed between the adjacent display part LDA. The display part LDA may form a structural part based on combining pixels, and the transmission part LTA may be positioned between the adjacent unit structures.

The transmission part LTA may include transparent layers so that light may transmit through. No conductive layer or semiconductor layer that may block or impede light transmission is positioned on the transmission part LTA. The transmission part LTA also may include a pixel defining layer PDL. The light blocking layer BM that includes a light blocking material also may include an opening overlapping a position that corresponds to the transmission part LTA to provide a structure that does not block light.

The transmission part LTA may include a buffer layer BF and a gate insulating layer GI disposed on the substrate SUB. The disclosure shows an embodiment in which the first insulating layer IL1, the second insulating layer IL2, the pixel defining layer PDL, and the spacer SPC may not be positioned in the transmission part LTA, and transparent layers from among them may be modified to be positioned in the transmission part LTA. In another example, the foregoing may be modified into a structure from which both or part of the buffer layer BF and/or the gate insulating layer GI may be removed.

The pixel defining layer PDL may include a first-3 opening OP1-3 overlapping the transmission part LTA. The pixel defining layer PDL may be removed from the transmission part LTA. The pixel defining layer PDL including a light blocking material may not overlap the transmission part LTA and may be spaced from the same.

The first functional layer FL1 and the second functional layer FL2 extending from the display part LDA may be positioned in the transmission part LTA.

An end of the second electrode E2 extending from the display part LDA may be disposed on the second functional layer FL2 in the transmission part LTA. The second electrode E2 may not be positioned in the most region of the transmission part LTA. However, without being limited thereto, the second electrode E2 may be removed so that it may not totally overlap the transmission part LTA.

A low adhesion layer WAL may be positioned in the transmission part LTA. The low adhesion layer WAL may be positioned on the second functional layer FL2 in the transmission part LTA. The low adhesion layer WAL may be a material with low adherence. The second electrode E2 may not be disposed on an upper portion of the low adhesion layer WAL. The low adhesion layer WAL may include a material having a characteristic that enables the second electrode E2 to be formed to be very thin in a thickness direction DR3.

The disclosure has shown and described the embodiment in which the low adhesion layer WAL is positioned in the transmission part LTA, and in an embodiment, the low adhesion layer WAL may not be positioned, and at least part of the second electrode E2 may be removed according to a laser process. The laser process may be performed on the second electrode E2.

The first capping layer AL1 and the second low reflection layer AL2*a* may be positioned on the low adhesion layer WAL in the transmission part LTA.

The first low reflection layer AL2 may include an inorganic material in the display area DA, and the second low reflection layer AL2*a* may include an inorganic oxide in the transmission part LTA.

The first low reflection layer AL2 may be deposited on the capping layer AL1, and the first low reflection layer AL2 overlapping the transmission part LTA may undergo an oxidation treatment to thus form a second low reflection layer AL2*a*; hence, the second low reflection layer AL2*a* may be formed based on an oxidation treatment applied to at least a portion of the first low reflection layer AL2. For example, the first low reflection layer AL2 of the transmission part LTA may be patterned to be exposed by using a photolithography process, and an oxygen doping process or a plasma process is progressed to form the second low reflection layer AL2*a*. In another example, laser beams may be irradiated to the first low reflection layer AL2 overlapping the transmission part LTA to form the second low reflection layer AL2*a*.

For example, the second low reflection layer AL2*a* positioned in the transmission part LTA may be a metal oxide oxidized by performing a laser or plasma process to the first low reflection layer AL2 in the display area DA. For example, it may include $Bi_2O_3$, $MoO_2$, $MoO_3$, $Ta_2O_5$, $NbO_2$, $SnO_2$, $ZrO_2$, $HfO_2$, $F_2O_3$, ZnO, ITO, CdO, $SiO_2$, $TiO_2$, $Al_2O_3$, $Y_2O_3$, BeO, MgO, $PbO_2$, $WO_3$, $SiN_x$, LiF, $CaF_2$, $MgF_2$, CdS, and/or combinations thereof.

The absorption coefficient k of the inorganic oxide included in the second low reflection layer AL2*a* positioned in the transmission part LTA may be equal to or less than about 0.5 ($k \leq 0.5$). Further, a thickness of the second low reflection layer AL2*a* may be about 1 nm to about 100 nm. As the second low reflection layer AL2*a* overlapping the transmission part LTA includes an inorganic oxide, transmittance of the second component area EA2 may be increased.

An encapsulation layer ENC may be positioned on the first and second low reflection layers AL2 and AL2*a*. The first touch insulating layer TIL1 and the second touch insulating layer TIL2 may be positioned on the encapsulation layer ENC. The first conductive layer TIL1 and the second conductive layer TL2 included by the touch sensor may not overlap the transmission part LTA.

A second-3 opening OP2-3 included by the light blocking layer BM may be positioned on the second touch insulating layer TIL2. The transmission part LTA may overlap the second-3 opening OP2-3 of the light blocking layer BM. The light blocking layer BM may be removed from the transmission part LTA, for example the transmission part LTA may not overlap the light blocking layer BM.

A reflection adjusting layer OL may be disposed on the light blocking layer BM. The reflection adjusting layer OL may selectively absorb light with a wavelength in a predetermined bandwidth from among the light reflected from the inside of the display device or the light input from the outside of the display device. The reflection adjusting layer OL may fill openings among the light blocking layer BM.

The reflection adjusting layer OL may be made of an organic material layer including a dye, a pigment, and/or a combination thereof. The reflection adjusting layer OL may absorb reflection of external light of the display device and may increase visibility. The transmittance of the reflection adjusting layer OL may be adjusted according to a content of the pigment and/or the dye included in the reflection adjusting layer OL.

As described above, according to the embodiment, the low reflection layer AL2 made of a metal oxide may be included in the regions EA1 and EA2 in which the first and second components are formed so the transmittance may be increased. In addition, as the low reflection layer AL2 includes a metal in the display area DA, the destructive interference between the light input to the display panel and the light reflected from the metal disposed on the lower portion of the low reflection layer AL2 may reduce the reflectance of external light. The display device may reduce the reflectance of external light in the display area DA and increase the transmittance in the component area EA.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:

a display area and a component area at least partly surrounded by the display area;

a light-emitting device disposed on a substrate in the display area and including:

a first electrode;

an emission layer; and a second electrode;

a capping layer disposed on the light-emitting device;

a reflection layer comprising a first low reflection layer overlapping the display area in a plan view and a second low reflection layer overlapping the component area in the plan view, the first and second low reflection layers disposed on the capping layer, the first and second low reflection layers being adjacent to each other in the plan view, the first and second low reflection layers not overlapping each other in the plan view, and the first and second low reflection layers comprising materials that are different from each other;

an encapsulation layer disposed on the first low reflection layer; and a reflection adjusting layer disposed on the encapsulation layer, wherein the second low reflection layer includes an inorganic oxide.

2. The display device of claim 1, wherein the first low reflection layer includes an inorganic material, and an absorption coefficient k of the inorganic oxide is less than a corresponding absorption coefficient k of the inorganic material.

3. The display device of claim 1, wherein an absorption coefficient k of the inorganic oxide is equal to or less than about 0.5.

4. The display device of claim 1, wherein the second low reflection layer includes a metal oxide.

5. The display device of claim 1, wherein the first low reflection layer includes an inorganic material, and the inorganic material is bismuth (Bi), ytterbium (Yb), cobalt (Co), molybdenum (Mo), tin (Sn), titanium (Ti), zirconium (Zr), aluminum (Al), chromium (Cr), niobium (Nb), platinum (Pt), tungsten (W), indium (In), iron (Fe), nickel (Ni), tantalum (Ta), manganese (Mn), zinc (Zn), germanium (Ge), silver (Ag), magnesium (Mg), gold (Au), copper (Cu), calcium (Ca), or a combination thereof.

6. The display device of claim 1, wherein the inorganic oxide is $Bi_2O_3$, $MoO_2$, $MoO_3$, $Ta_2O_5$, $NbO_2$, $SnO_2$, $ZrO_2$, $HfO_2$, $Fe_2O_3$, ZnO, ITO, CdO, $SiO_2$, $TiO_2$, $Al_2O_3$, $Y_2O_3$, BeO, MgO, $PbO_2$, $WO_3$, SiNx, LiF, $CaF_2$, $MgF_2$, CdS, or a combination thereof.

7. The display device of claim 1, wherein the second low reflection layer is formed based on an oxidation treatment according to at least one of irradiation of laser beams, gas doping, and a plasma process.

8. The display device of claim 1, further comprising:

a light blocking layer disposed between the encapsulation layer and the reflection adjusting layer, and having an opening overlapping the emission layer in the plan view.

9. The display device of claim 1, wherein the display device includes:

a first conductive layer disposed on the encapsulation layer;

a first touch insulating layer disposed on the first conductive layer;

a second conductive layer disposed on the first touch insulating layer; and a second touch insulating layer disposed on the second conductive layer.

10. The display device of claim 1, further comprising:

an optical element overlapping the component area in the plan view, wherein the optical element is disposed on a rear side of the substrate.

11. The display device of claim 1, wherein a thickness of the second low reflection layer is about 1 nm to about 100 nm.

12. The display device of claim 1, wherein the second low reflection layer overlaps only the component area in the plan view and has an absorption coefficient k equal to or less than about 0.5.

13. An electronic device comprising:

a housing;

a cover window disposed on an upper portion of the housing;

a display panel disposed on a lower portion of the cover window and including a display area and a component area surrounded by the display area; and an optical element disposed on a rear side of the display panel and overlapping the component area in a plan view, wherein the display panel includes:

a light-emitting device overlapping the display area in the plan view and including a first electrode, an emission layer, and a second electrode, a capping layer disposed on the light-emitting device, a reflection layer comprising a first low reflection layer overlapping the display area in the plan view and a second low reflection layer overlapping the component area in the plan view, the first and second low reflection layers disposed on the capping layer, the first and second low reflection layers being adjacent to each other in the plan view, the first and second low reflection layers not overlapping each other in the plan view, and the first and second low reflection layers comprising materials that are different from each other, an encapsulation layer disposed on the first low reflection layer, and a reflection adjusting layer disposed on the encapsulation layer, and wherein the second low reflection layer includes an inorganic oxide.

14. The electronic device of claim 13, wherein the first low reflection layer includes an inorganic material, and an absorption coefficient k of the inorganic oxide is less than a corresponding absorption coefficient k of the inorganic material.

15. The electronic device of claim 13, wherein an absorption coefficient k of the inorganic oxide is equal to or less than about 0.5.

16. The electronic device of claim 13, wherein the second low reflection layer includes a metal oxide.

17. The electronic device of claim 13, wherein the first low reflection layer includes an inorganic material, and the inorganic material is bismuth (Bi), ytterbium (Yb), cobalt (Co), molybdenum (Mo), tin (Sn), titanium (Ti), zirconium (Zr), aluminum (Al), chromium (Cr), niobium (Nb), platinum (Pt), tungsten (W), indium (In), iron (Fe), nickel (Ni), tantalum (Ta), manganese (Mn), zinc (Zn), germanium (Ge), silver (Ag), magnesium (Mg), gold (Au), copper (Cu), calcium (Ca), or a combination thereof.

18. The electronic device of claim 13, wherein the inorganic oxide is $Bi_2O_3$, $MoO_2$, $MoO_3$, $Ta_2O_5$, $NbO_2$, $SnO_2$, $ZrO_2$, $HfO_2$, $Fe_2O_3$, ZnO, ITO, CdO, $SiO_2$, $TiO_2$, $Al_2O_3$, $Y_2O_3$, BeO, MgO, $PbO_2$, $WO_3$, SiNx, LIF, $CaF_2$, $MgF_2$, CdS, or a combination thereof.

19. The electronic device of claim 13, wherein the second low reflection layer is formed based on an oxidation treatment according to at least one of irradiation of laser beams, gas doping, and a plasma process.

20. The electronic device of claim 13, further comprising:

a light blocking layer disposed between the encapsulation layer and the reflection adjusting layer, and having an opening overlapping the emission layer in the plan view.

21. The electronic device of claim 13, wherein a thickness of the second low reflection layer is about 1 nm to about 100 nm.

* * * * *